United States Patent

Yamane et al.

[11] Patent Number: 5,844,755
[45] Date of Patent: Dec. 1, 1998

[54] GIANT MAGNETORESISTIVE INFORMATION RECORDING MEDIUM, AND ASSOCIATED RECORDING AND REPRODUCING METHOD AND APPARATUS

[75] Inventors: Haruki Yamane; Yoshinori Maeno; Masanobu Kobayashi, all of Tokyo, Japan

[73] Assignee: Oki Electric Industry Co., Ltd., Tokyo, Japan

[21] Appl. No.: 569,609

[22] Filed: Dec. 8, 1995

[30] Foreign Application Priority Data

Dec. 22, 1994 [JP] Japan .................................. 6-320568

[51] Int. Cl.⁶ ............................ G11B 5/02; G11B 5/127; G11B 5/33; H01L 43/00
[52] U.S. Cl. .......................... 360/113; 360/55; 338/32 R
[58] Field of Search .................. 360/113, 55; 338/32 R; 324/252, 207.21; 365/157, 158, 48; 257/295

[56] References Cited

U.S. PATENT DOCUMENTS

| | | | |
|---|---|---|---|
| 5,231,294 | 7/1993 | Takeuchi et al. | 257/28 |
| 5,303,182 | 4/1994 | Nakao et al. | 257/295 |
| 5,343,422 | 8/1994 | Kung et al. | 365/158 |
| 5,477,482 | 12/1995 | Prinz | 365/158 |
| 5,583,727 | 12/1996 | Parkin | 360/113 |
| 5,587,235 | 12/1996 | Suzuki et al. | 360/113 |

FOREIGN PATENT DOCUMENTS

| | | |
|---|---|---|
| 315 361 | 5/1989 | European Pat. Off. . |
| 346 817 | 12/1989 | European Pat. Off. . |
| 412 829 | 2/1991 | European Pat. Off. . |
| 504 473 | 9/1992 | European Pat. Off. . |
| 613 148 | 8/1994 | European Pat. Off. . |
| 40 30 404 | 4/1992 | Germany . |
| 6325934 | 11/1993 | Japan . |
| WO95/10112 | 4/1995 | WIPO . |

OTHER PUBLICATIONS

Dieny et al., "Giant magnetoresistance in soft ferro–magnetic multilayers," Physical Review B, vol. 43, No. 1, Jan. 1, 1991,American Physical Society,pp. 1297–1300.
Daughton, "Magnetoresistive memory technology," Thin Solid Films 216 (1992), pp. 162–168, Elsevier Sequoia.
Yano et al, The Japan Society for Precision Engineering, "Hikari to Jiki no Kiroku Gitutsu" (Optical and Magnetic Recording Technology) Ohm (1992), Chapt. 2, pp. 11–14.

Primary Examiner—Tom Thomas
Assistant Examiner—Adriana Giordana
Attorney, Agent, or Firm—Spencer & Frank

[57] ABSTRACT

Information is recorded by applying weak and strong magnetic fields to a giant magnetoresistive medium having a pair of ferromagnetic layers, a nonmagnetic interlayer, and an antiferromagnetic layer. The medium preferably has a magnesium-oxide base layer, and may also have an electrode layer. The weak magnetic field magnetizes the ferromagnetic layers in the antiparallel state. The strong magnetic field magnetizes the ferromagnetic layers in the parallel state, which has lower electrical resistance than the antiparallel state. The recorded information is reproduced by detecting the electrical resistance of the medium, either between two electrodes contacting the surface of the medium, or between the electrode layer in the medium and an electrode contacting the surface of the medium.

34 Claims, 14 Drawing Sheets

GIANT MAGNETORESISTIVE INFORMATION RECORDING MEDIUM, AND ASSOCIATED RECORDING AND REPRODUCING METHOD AND APPARATUS

BACKGROUND OF THE INVENTION

The present invention relates to a magnetic information recording medium, and to methods and apparatus for recording and reproducing information therein.

Information is often recorded or written on magnetic media by controlling the orientation of the magnetization of magnetic domains. Such information is conventionally reproduced or read by sensing the magnetic fields created by the magnetized domains.

Past methods of sensing relied on the principle of electromagnetic induction, detecting the voltages produced by relative motion of an inductor through the magnetic fields, but inductive sensing has certain widely recognized disadvantages. One is that, to produce a sufficiently strong signal, the media must move at high speed with respect to the inductor. This was one factor constraining the design of the reproducing apparatus, and limiting the density with which information could be stored. Another disadvantage is that small, highly sensitive inductors are difficult to fabricate. This was another factor limiting the storage density, and complicating the manufacture of the reproducing apparatus.

Recently, magnetoresistive methods of sensing magnetic fields have been developed and applied. Hard disk drives with magnetoresistive read heads have achieved storage densities far higher than possible with inductive read heads, and the giant magnetoresistive or spin-valve effect discovered in 1988 promises even further gains.

Magnetoresistive heads continue to read media of the conventional type, however, by sensing magnetic fields and converting a magnetic signal to an electrical signal. For many applications it would be desirable to obtain an electrical signal directly from the media, without the need for any type of magnetic field sensing.

SUMMARY OF THE INVENTION

It is accordingly an object of the present invention to provide information recording media from which information can be reproduced directly as an electrical signal.

Another object of the invention is to provide information recording media from which information can be reproduced without relative motion between the media and the reproducing apparatus.

Yet another object is to provide methods of recording and reproducing information on such media.

Still another object is to provide apparatus for recording and reproducing information on such media.

The invented information recording medium is a giant magnetoresistive multilayer consisting of a first ferromagnetic layer, a second ferromagnetic layer, a nonmagnetic interlayer, and an antiferromagnetic layer. The two ferromagnetic layers represent one information value when magnetized in a mutually parallel state and another information value when magnetized in a mutually antiparallel state. The electrical resistance of the ferromagnetic layers is lower in the mutually parallel state than in the mutually antiparallel state.

The nonmagnetic interlayer is disposed between the ferromagnetic layers to prevent exchange coupling between them. The antiferromagnetic layer is disposed adjacent to the second ferromagnetic layer and biases the ferromagnetic layers so that the second ferromagnetic layer is more easily magnetized than the first ferromagnetic layer in one direction, and less easily magnetized than the first ferromagnetic layer in the opposite direction.

The medium preferably has a dielectric base layer of magnesium oxide adjacent to either the first ferromagnetic layer or the antiferromagnetic layer. The medium may also have an electrode layer disposed between the base layer and the first ferromagnetic layer or antiferromagnetic layer.

The invented recording and reproducing method comprises the steps of:

applying a first magnetic field to selected regions of the invented medium, thereby magnetizing the two ferromagnetic layers in the mutually antiparallel state and recording one information value;

applying a second magnetic field, stronger than the first magnetic field, to selected regions of the medium, thereby magnetizing the two ferromagnetic layers in the mutually parallel state and recording a different information value; and reproducing the information values thus recorded by detecting the electrical resistance of the medium.

The invented recording and reproducing apparatus comprises a recording head for applying the first and second magnetic fields to the medium, and a reproducing head for detecting the electrical resistance of the medium.

The electrical resistance of the medium can be detected by placing at least two electrodes in contact with the surface of the medium and detecting the electrical resistance between the electrodes. If the medium has an electrode layer, electrical resistance can be detected by placing at least one electrode in contact with the surface of the medium and detecting electrical resistance between the electrode and the electrode layer.

DETAILED DESCRIPTION OF THE INVENTION

Embodiments of the invention will be described with reference to the attached drawings. These drawings show the shapes, sizes, and positional relationships of component elements schematically, and are intended only to explain the invention, not to define its scope.

First medium embodiment

Figure 1:
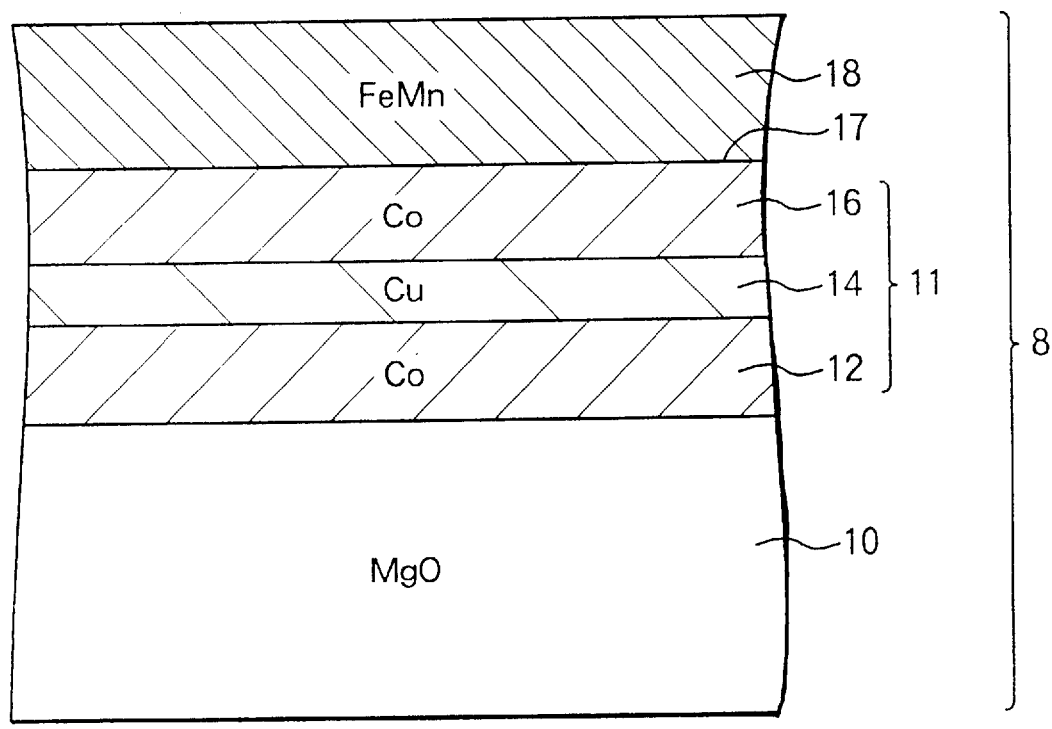
FIG. 1 illustrates a first embodiment of the invented information recording medium.

FIG. 1 illustrates a first novel information recording medium. The medium 8 comprises a base layer 10 supporting a triple-layer sandwich 11 consisting of a first ferromagnetic layer 12, a nonmagnetic interlayer 14, and a second ferromagnetic layer 16. The upper surface 17 of the sandwich 11 adjoins an antiferromagnetic layer 18. The base layer 10 comprises magnesium oxide. The first and second ferromagnetic layers 12 and 16 are cobalt films with a thickness of sixty angstrom units (60 Å). The nonmagnetic interlayer 14 is a copper film with a thickness of 28 Å. The antiferromagnetic layer 18 is a crystalline iron-manganese alloy film with a thickness of 210 Å.

The sandwich 11 exhibits the giant magnetoresistive effect. When the first and second ferromagnetic layers 12 and 16 are magnetized in the same direction, creating the parallel magnetization state illustrated in FIG. 2A, the electrical resistance of the medium is relatively low. When the first and second ferromagnetic layers 12 and 16 are magnetized in opposite directions, creating the antiparallel magnetization state illustrated in FIG. 2B, the electrical resistance of the medium is relatively high. This effect is thought to arise from spin polarization of the conduction electrons, and is also referred to as the spin-valve effect.

Figure 2A:
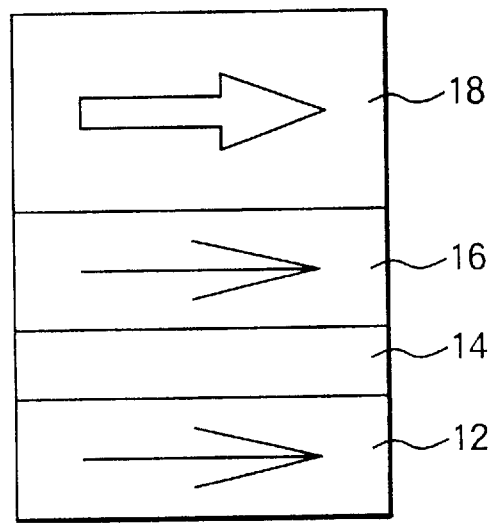
FIG. 2A illustrates the first embodiment in the low-resistance state.
Figure 2B:
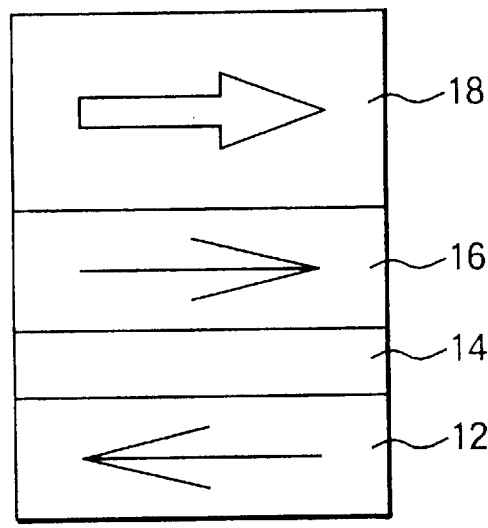
FIG. 2B illustrates the first embodiment in the high-resistance state.

Information can be recorded by, for example, using the parallel state in FIG. 2A to represent a binary zero, and the antiparallel state in FIG. 2B to represent a binary one. The recorded information can be reproduced by detecting the differing electrical resistances in the two states: for example, by passing a fixed current through the medium and detecting the resulting voltage drop. An electrical signal (in this case, a voltage signal) is thereby obtained directly from the medium.

The antiferromagnetic layer 18 is magnetized during fabrication of the medium and has a substantially fixed magnetic orientation, indicated by the large arrow pointing to the right in FIGS. 2A and 2B. The second ferromagnetic layer 16 is strongly biased by anisotropic exchange coupling with the antiferromagnetic layer 18, and can be most easily magnetized in the same direction as the antiferromagnetic layer 18. The first ferromagnetic layer 12 is decoupled from the second ferromagnetic layer 16 by the nonmagnetic interlayer 14, and is less strongly biased by the antiferromagnetic layer 18, so switching the orientation of the magnetization of the first ferromagnetic layer 12 is comparatively easy.

Magnesium oxide is a dielectric substance, so the base layer 10 in FIG. 1 can serve to insulate the giant magnetoresistive sandwich 11 from an underlying substrate such as a metal plate, disk, or drum (not visible) on which the medium 8 is formed. The magnesium-oxide base layer 10 has also been found to improve the magnetoresistive characteristics of the medium, as described later.

Next the response of the medium 8 in FIG. 1 to an applied magnetic field will be described with reference to FIGS. 3A and 3B. The applied field will be described as positive if its magnetic vector points to the right in these drawings, and negative if the magnetic vector points to the left.

Figure 3A:
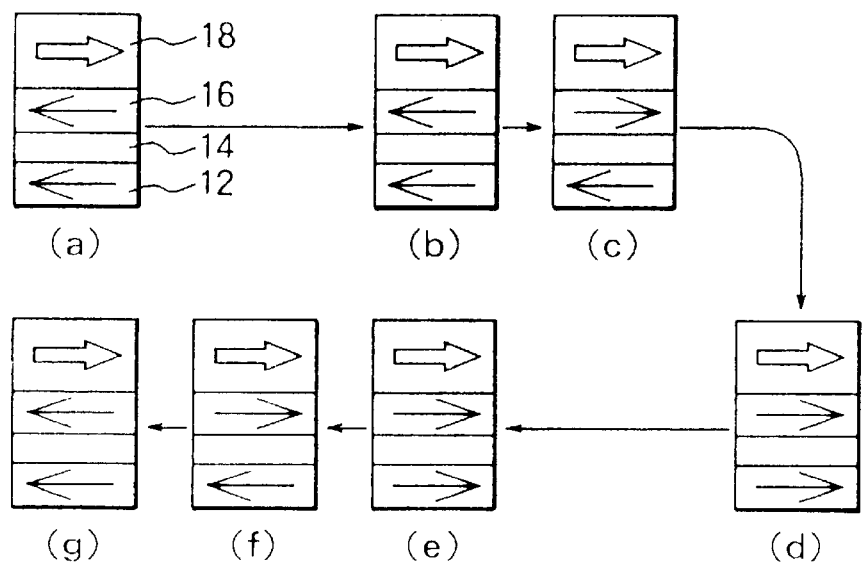
FIG. 3A illustrates magnetic transitions as an applied magnetic field is swept up and down.

FIG. 3A illustrates the magnetic response of the medium 8. Initially, a strong negative magnetic field is applied, magnetizing both the first and second ferromagnetic layers 12 and 16 in the left-pointing direction (a). The applied magnetic field is then swept upward from negative toward positive. Cobalt is a hard ferromagnetic material with high coercivity, so when the applied field intensity reaches zero, the first and second ferromagnetic layers 12 and 16 remain magnetized in the same left-pointing direction (b).

As the applied field continues to sweep upward, its magnetic vector now pointing toward the right, first the magnetization of the second ferromagnetic layer 16 flips over so that it points toward the right (c). This occurs at a certain weak positive applied field intensity $H_{+W}$. At a stronger applied field intensity $H_{+S}$, the magnetization of the first ferromagnetic layer 12 also flips over to point toward the right (d).

The applied magnetic field is next swept down. When the applied field intensity reaches zero again, the first and second ferromagnetic layers 12 and 16 remain magnetized toward the right (e). At a certain comparatively weak negative field intensity $H_{-W}$, the magnetization of the first ferromagnetic layer 12 flips back to point to the left (f). At a stronger negative field intensity $H_{-S}$, the magnetization of the second ferromagnetic layer 16 also flips back to the left (g).

On the up-sweep, the second ferromagnetic layer 16 flips alignment before the first ferromagnetic layer 12 because the second ferromagnetic layer 16 has a stronger tendency to align its magnetization with that of the antiferromagnetic layer 18. For the same reason, on the down-sweep, the first ferromagnetic layer 12 flips alignment before the second ferromagnetic layer 16.

Figure 3B:
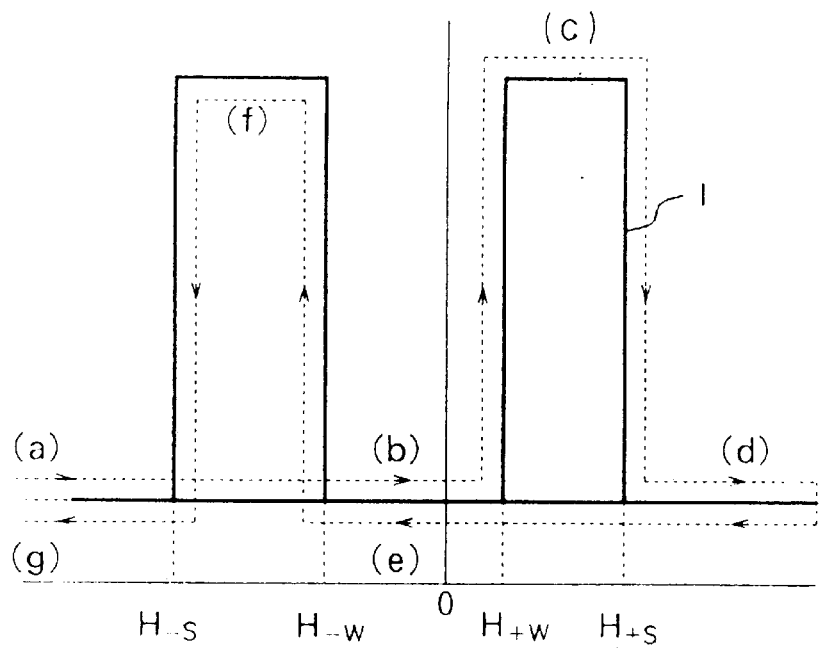
FIG. 3B shows an idealized magnetoresistance curve corresponding to the transitions in FIG. 3A.

FIG. 3B indicates the idealized magnetoresistive response of the medium 8. The horizontal axis indicates the intensity of the applied magnetic field in arbitrary units. The vertical axis indicates the electrical resistance of the medium 8 in arbitrary units. The solid line I is the magnetoresistance curve. The dashed line with arrows indicates the path followed as the applied magnetic field is swept up from state (a) to state (d) and down from state (d) to state (g), these letters having the same meaning as in FIG. 3A.

In states (a), (b), (d), (e), and (g), the magnetization of ferromagnetic layers 12 and 16 is aligned in the parallel state, so the electrical resistance is relatively low. In states (c) and (f) the alignment is antiparallel, so the electrical resistance is relatively high. The magnetoresistance curve I thus exhibits a double hysteresis loop, with transitions occurring at applied field intensities of $H_{-S}$, $H_{-W}$, $H_{+W}$, and $H_{+S}$.

Figure 4A:
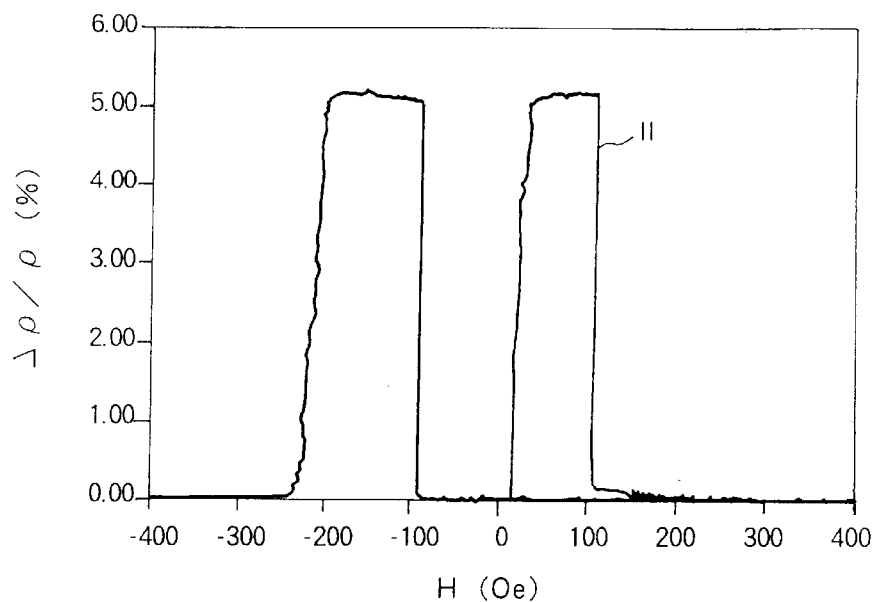
FIG. 4A shows a magnetoresistance curve derived from actual measurements.

FIG. 4A shows a magnetoresistance curve II obtained from actual measurements performed on the medium 8 in FIG. 1. The horizontal axis indicates the intensity of the applied magnetic field (H) in oersteds (Oe). The vertical axis indicates the percent change of the electrical resistivity (ρ) of the medium 8, referenced to the low-resistance state in which the orientations of the magnetization of the ferromagnetic layers 12 and 16 are parallel. The electrical resistivity is about 5% higher in the high-resistance state than in the low-resistance state.

Figure 4B:
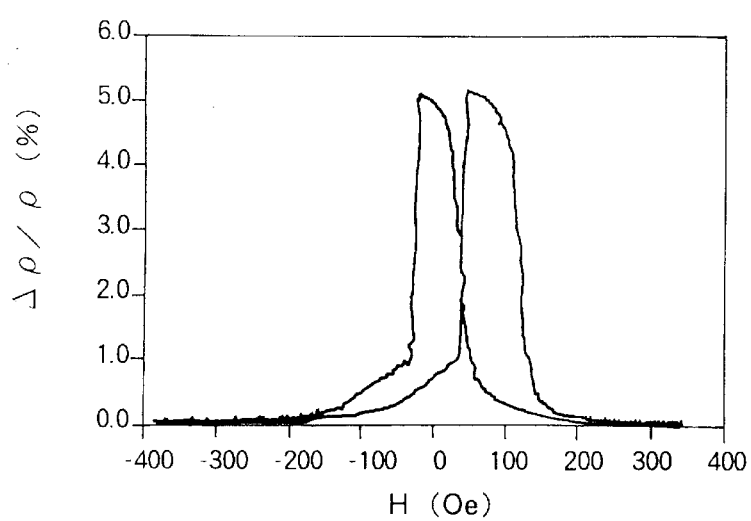
FIG. 4B shows a measured magnetoresistance curve when the magnesium-oxide base layer is replaced by glass.

The clear separation and well-defined rectangular shape of the hysteresis loops in FIG. 4A, with fairly sharp resistance transitions at −210 Oe ($H_{-S}$) and 20 Oe ($H_{+W}$), very sharp resistance transitions at −90 Oe ($H_{-W}$) and 110 Oe ($H_{+S}$), and little resistance variation elsewhere, is attributable to the magnesium-oxide base layer 10. For comparison, FIG. 4B shows the measured magnetoresistance curve of a medium having no magnesium-oxide base layer 10, the giant magnetoresistive sandwich 11 being formed directly on a glass substrate instead. The horizontal and vertical axes have the same meaning in FIG. 4B as in FIG. 4A. The hysteresis loops in FIG. 4B overlap, their shapes are not rectangular, and the transitions are not as sharp as in FIG. 4A. Reliably recording and reproducing information would be more difficult on a medium with these magnetoresistive characteristics than on the medium 8 with the characteristics shown in FIG. 4A.

As shown in FIGS. 3B and 4A, $H_{+W}$ and $H_{+S}$ have smaller absolute values than $H_{-W}$ and $H_{-S}$. The reason is that the magnetization of both the first and second ferromagnetic layers 12 and 16 aligns more easily in the same direction as the magnetization of the antiferromagnetic layer 18 than in the opposite direction.

In the subsequent description, an applied magnetic field described as strong will be strong enough to reverse the magnetization of both ferromagnetic layers 12 and 16. A magnetic field described as weak will be strong enough to reverse the magnetization of one of the two ferromagnetic layers, but not strong enough to reverse the magnetization of the other ferromagnetic layer. None of the applied magnetic fields will be strong enough to change the magnetization of the antiferromagnetic layer 18.

First recording method and apparatus

Figure 5:
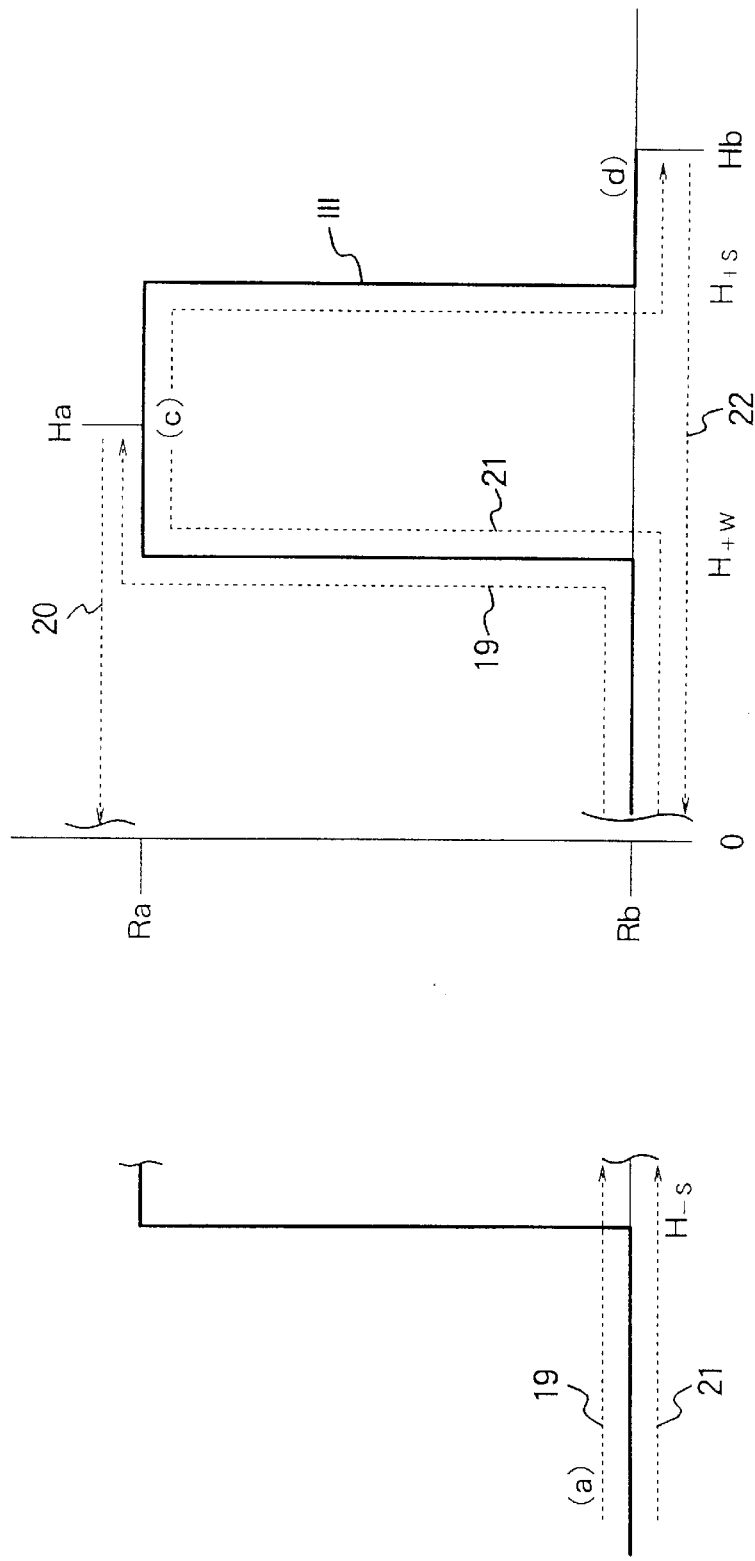
FIG. 5 shows a magnetoresistance curve and illustrates a first method of recording information.

A first method of recording information on the medium 8 of FIG. 1 will now be described. This method employs an initializing magnetic field and two recording fields. The method is illustrated in FIG. 5, which shows an idealized magnetoresistance curve III. The horizontal and vertical axes and the symbols $H_{-S}$, $H_{-W}$, $H_{+W}$, $H_{+S}$, (c), and (d) have the same meaning as in FIG. 3B.

Before information is recorded, the medium is initialized by applying an initializing field $H_i$ with a strong negative intensity, exceeding $H_{-S}$. The medium is thereby initialized to the low-resistance state (a) described in FIGS. 3A and 3B, in which both ferromagnetic layers 12 and 16 are magnetized in a direction opposite to the antiferromagnetic layer 18.

To record one binary information value ('1' for example), a magnetic field $H_a$ with a weak positive intensity intermediate between $H_{+W}$ and $H_{+S}$ is applied, then removed. When this field $H_a$ is applied, the resistance of the medium shifts along path 19, reaching the state (c) in which the magnetization of the first ferromagnetic layer 12 is antiparallel to the magnetization of the second ferromagnetic layer 16. The resistance value $R_a$ is therefore relatively high. When the field $H_a$ is removed, a shift along path 20 occurs, the ferromagnetic layers retaining their antiparallel magnetization and the medium its high resistance $R_a$.

To record the other binary information value ('0' for example), a magnetic field $H_b$ with a strong positive intensity exceeding $H_{+S}$ is applied, then removed. When this field $H_b$ is applied, the resistance of the medium shifts along path 21, passing through the high-resistance state (c) and reaching the low-resistance state (d) of parallel magnetization, with resistance value $R_b$. When the field $H_b$ is removed, a shift along path 22 occurs, the ferromagnetic layers retaining their parallel magnetization and the medium its low resistance $R_b$.

On the basis of the data in FIG. 4A, magnetic field intensities of $H_i$=−500 Oe, $H_a$=70 Oe, and $H_b$=300 Oe may be employed, although the invention is of course not limited to these particular intensities.

The first recording method has the advantage that on the recording pass, only the intensity of the applied magnetic field has to be modulated. The polarity of the applied magnetic field does not change.

Figure 6:
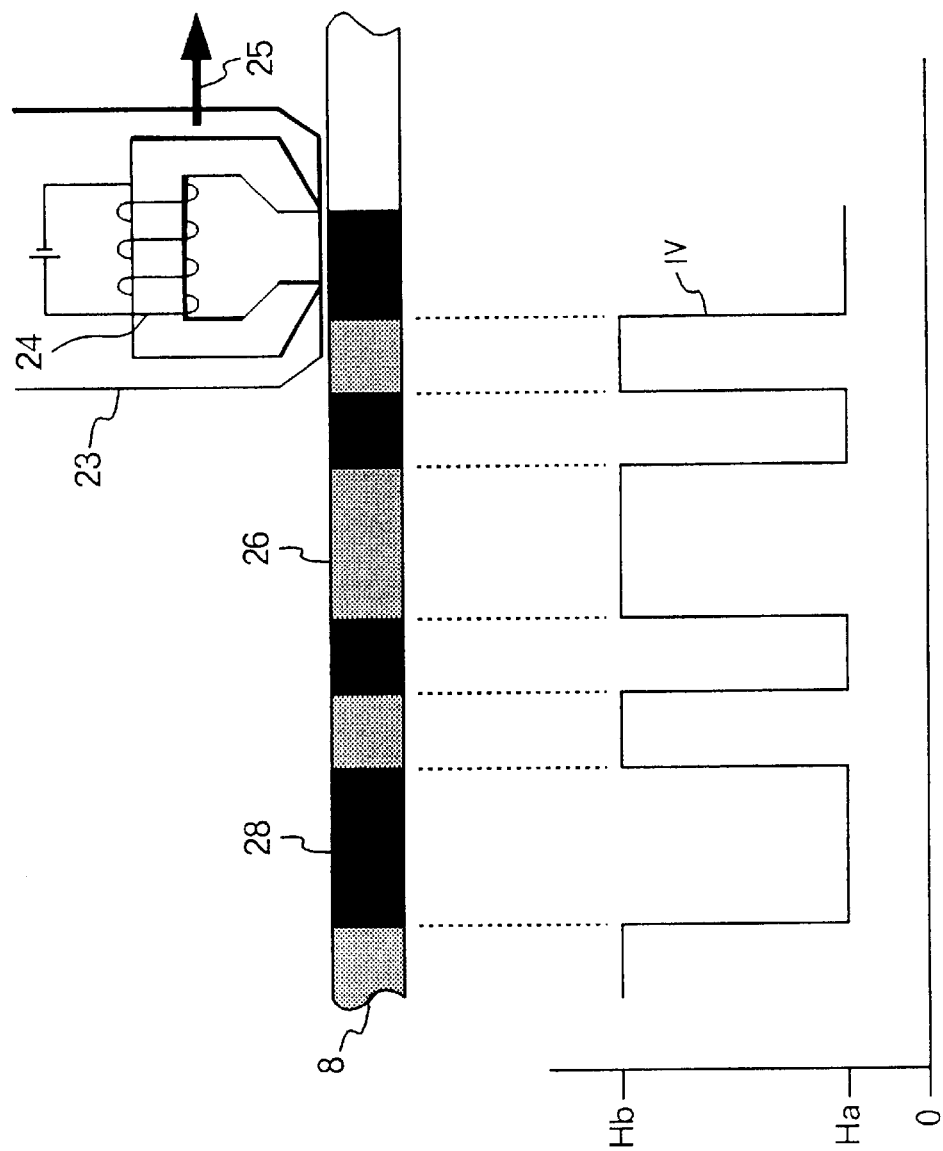
FIG. 6 shows the recording apparatus.

FIG. 6 schematically shows an apparatus that may be used to record information on the medium 8. The apparatus is a recording head 23 having an electromagnetic coil 24. The recording head 23 is moved across the medium 8 in the direction of the arrow 25, making two passes. In the graph at the bottom of FIG. 6, the horizontal axis represents the distance traveled by the recording head 23 and the vertical axis represents the intensity of the magnetic field generated by the coil 24.

On the first pass (not illustrated), the coil 24 is energized with current of one polarity and applies the initializing field $H_i$ to the medium. On the second pass, the coil 24 is energized with current of the opposite polarity, and the current is modulated between two levels so as to apply recording fields of weak and strong intensities $H_a$ and $H_b$, as indicated by curve IV. Low-resistance regions 26 and high-resistance regions 28 are thereby produced in the medium 8, representing binary data values of zero and one, and a pattern of binary bits is thus stored.

The arrow 25 represents relative motion between the recording head 23 and medium 8. The medium 8 may be stationary while the recording head 23 moves, or the recording head 23 may be stationary while the medium 8 moves.

This recording head 23 is similar to apparatus used for recording on conventional magnetic media, so a more detailed description will be omitted.

Second recording method and apparatus

Figure 7:
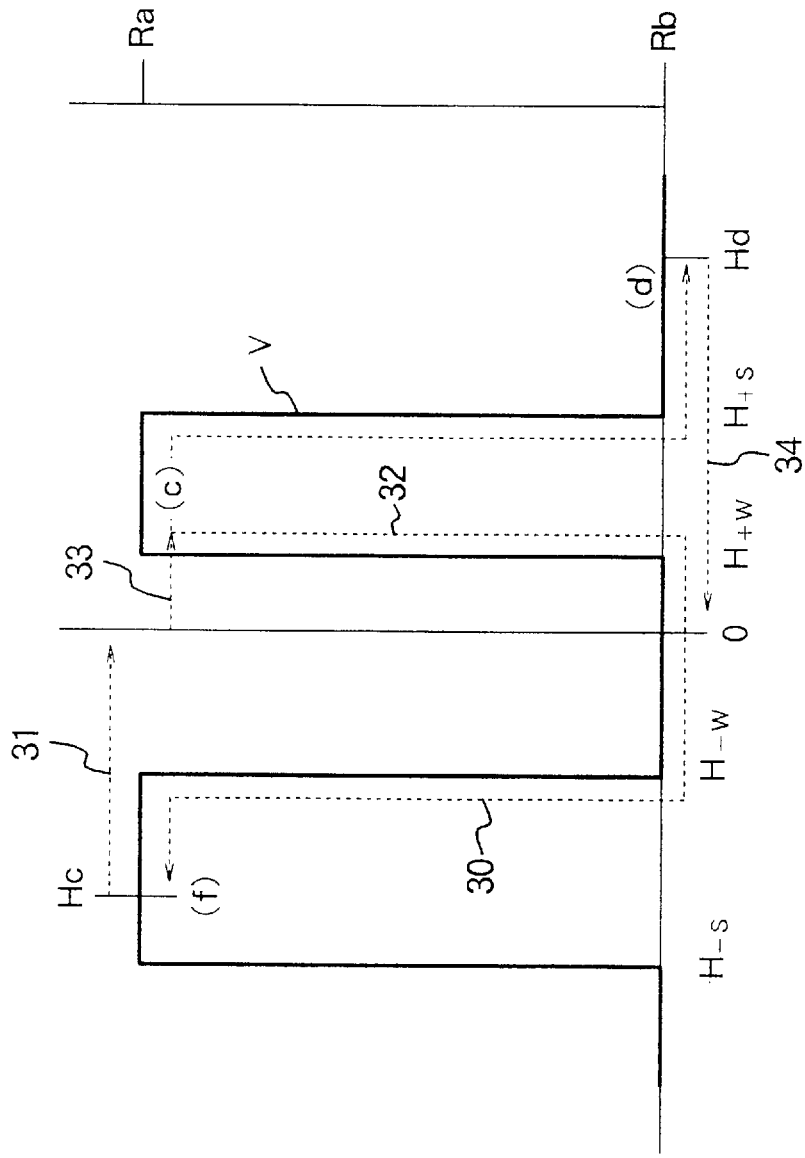
FIG. 7 shows a magnetoresistance curve and illustrates a second method of recording information.

A second method of recording information on the medium 8 is described below. This method employs only two recording fields. The method is illustrated in FIG. 7, which shows an idealized magnetoresistance curve V. The horizontal and vertical axes and the symbols $H_{-S}$, $H_{-W}$, $H_{+W}$, $H_{+S}$, (c), (d), and (f) have the same meaning as in FIG. 3B.

In this method the second ferromagnetic layer 16 of the medium 8 is always magnetized in the same direction as the antiferromagnetic layer 18 (the positive direction). The description starts from the low-resistance state, in which the first ferromagnetic layer 12 is also magnetized in the positive direction.

To record one binary information value ('1' for example), a magnetic field $H_c$ with a weak negative intensity intermediate between $H_{-W}$ and $H_{-S}$ is applied, then removed. When this weak field $H_c$ is applied, the resistance of the medium shifts along path 30, reaching a state (f) in which the magnetization of the first ferromagnetic layer 12 is antiparallel to the second ferromagnetic layer 16 and the electrical resistance is high. When the field $H_c$ is removed, a shift along path 31 occurs, the ferromagnetic layers retaining their antiparallel magnetization and the electrical resistance remaining high.

If the same weak magnetic field $H_c$ is applied and removed again, the state shifts back and forth along path 31, the electrical resistance remaining high.

To record the other binary information value ('0' for example), a magnetic field $H_d$ with a strong positive intensity, exceeding $H_{+S}$, is applied, then removed. When this strong field $H_d$ is applied, the resistance of the medium shifts along path 32 or path 33, depending on whether the previous resistance state was high or low. Both paths pass through the high-resistance state (c) to the low-resistance state (d). When the field $H_d$ is removed, a shift along path 34 occurs, the ferromagnetic layers retaining their parallel magnetization and the medium its low resistance.

On the basis of FIG. 4A, recording field intensities of $H_c=-150$ Oe and $H_d=300$ Oe may be employed, although the invention is of course not limited to these particular intensities.

The second recording method has the advantage that no initialization is required. Regardless of whether the existing resistance state of the medium is high or low, application of the weak magnetic field $H_c$ results in high electrical resistance, and application of the strong magnetic field $H_d$ results in low electrical resistance. Direct, one-pass overwriting is therefore possible.

The second recording method can be carried out using the apparatus illustrated in FIG. 6.

First reproducing method and apparatus

Figure 8:
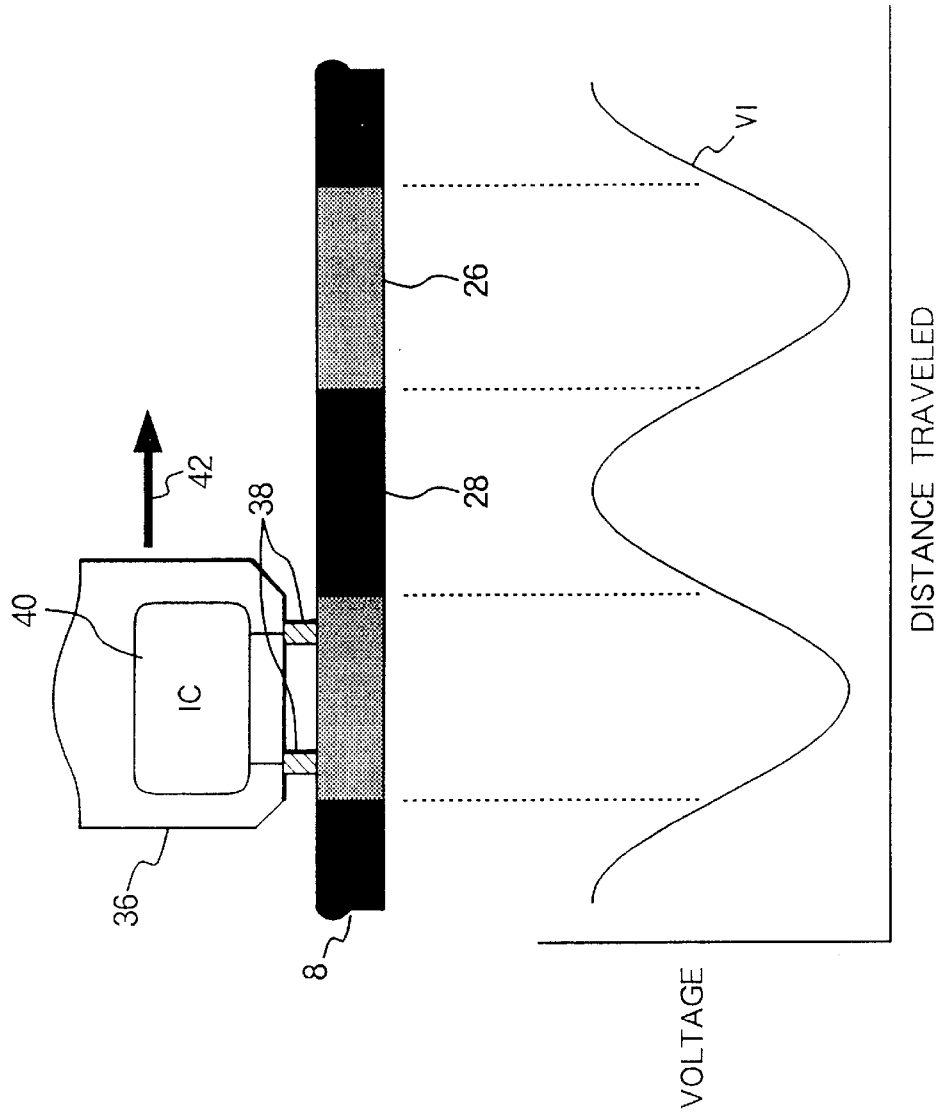
FIG. 8 illustrates a first method and apparatus for reproducing information.

FIG. 8 illustrates a first method and apparatus for reproducing the information recorded, by either the first or second recording method, on the medium 8. The first reproducing method uses a single pair of electrodes to detect the electrical resistance of the medium 8.

The first reproducing apparatus is a reproducing head 36 with two electrodes 38 coupled to a detector integrated circuit (IC) 40. The reproducing head 36 moves along the medium 8 in the direction of the arrow 42, while the electrodes 38 make sliding contact with the medium 8. The detector IC 40 detects variations in the electrical resistance of the medium 8 by supplying a substantially constant current between the two electrodes 38 and detecting voltage variations.

Curve VI in the graph at the bottom of FIG. 8 shows the voltage variations produced when the reproducing head 36 travels over an alternating pattern of high-resistance regions 28 and low-resistance regions 26. The horizontal axis of the graph indicates the distance traveled (in arbitrary units), while the vertical axis indicates voltage (in arbitrary units). If the reproducing head 36 traveled at a constant speed, then the horizontal axis may also be taken to represent time, since distance=speed×time.

Arrow 42 represents relative motion: the head 36 may travel over a stationary medium 8, or the medium 8 may travel past a stationary head 36. The speed of travel in either case is unrestricted. The strength of the voltage signal VI is independent of the speed of travel, so there is no need for the high relative speed required by conventional reproducing apparatus of the inductive type.

Second reproducing method and apparatus

Figure 9:
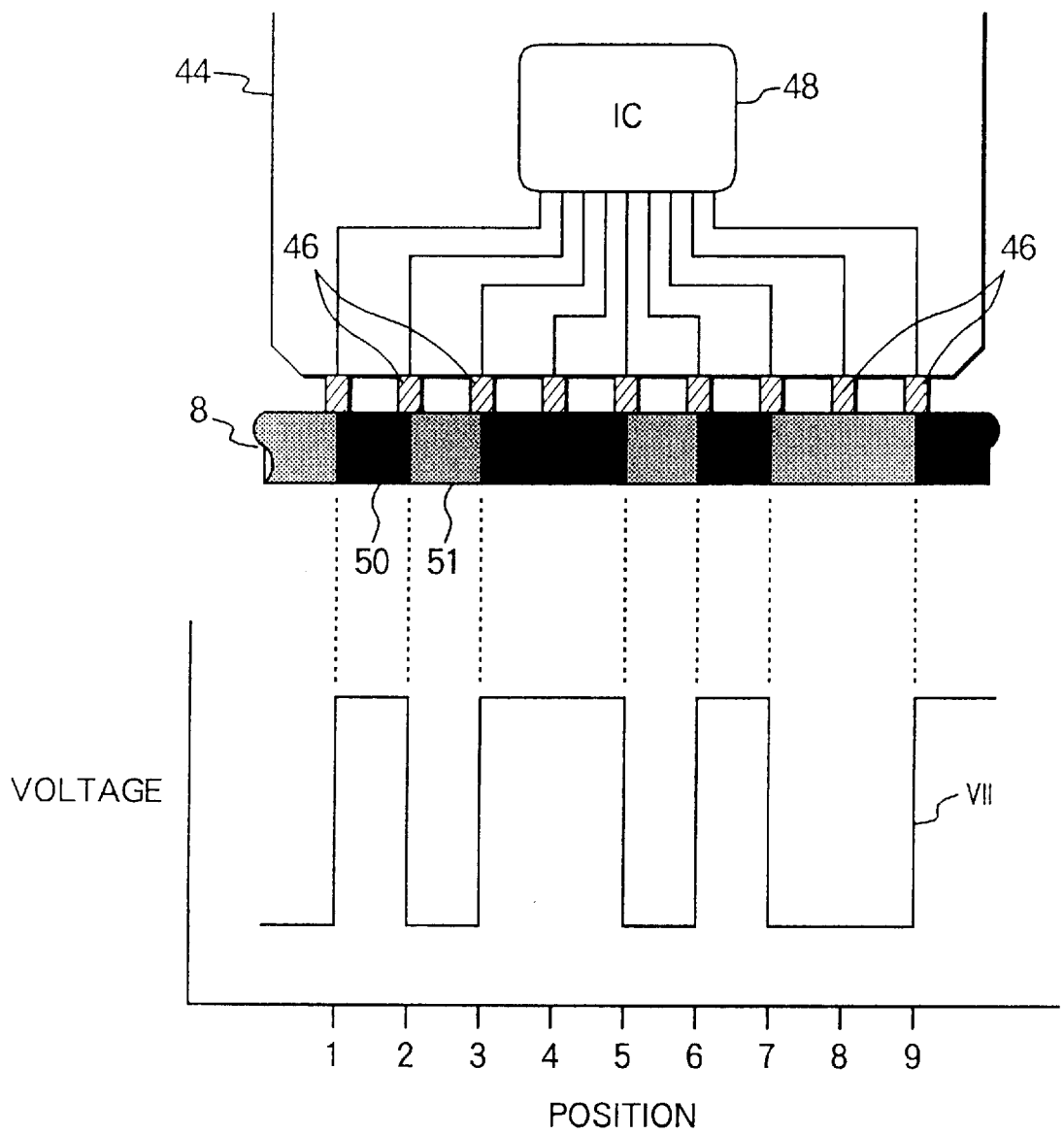
FIG. 9 illustrates a second method and apparatus for reproducing information.

FIG. 9 illustrates a second reproducing method and apparatus. The second method employs an array of electrodes.

The reproducing head 44 of this reproducing apparatus has an array of electrodes 46 which make contact with the medium 8 at the boundaries between adjacent bit recording regions or cells. All of the electrodes 46 are coupled to a detector IC 48 in the reproducing head 44.

In the drawing there are nine electrodes 46 and eight bit cells 50, 51, . . . , but in practice there may be many more electrodes 46 and bit cells.

The information stored in the medium 8 is reproduced by feeding a constant current between adjacent pairs of electrodes in turn and detecting the resulting voltages, as shown by curve VII in the graph at the bottom of FIG. 9. The horizontal axis in this graph represents the positions of the electrodes 46 by numbers from one to nine. The vertical axis represents voltage.

To read the information stored in the first bit cell 50, current is fed between electrode number one and electrode number two. In the drawing, this bit cell 50 has a high electrical resistance and produces a corresponding high voltage in the detector IC 48. To read the information stored in the next bit cell 51, current is fed between electrodes number two and three. In the drawing, this bit cell 51 has a low electrical resistance and produces a low voltage in the detector IC 48. Other bit cells are read similarly.

The method and apparatus illustrated in FIG. 9 can be used to read information without moving the reproducing head 44 relative to the medium 8. Alternatively, if the medium 8 is a card or sheet on which information is recorded in a plurality of tracks, the reproducing head 44 or medium 8 can be moved in a direction perpendicular to the paper, to read information recorded in all of the tracks, the electrodes 46 being positioned at the boundaries between tracks.

Second medium embodiment

Figure 10:
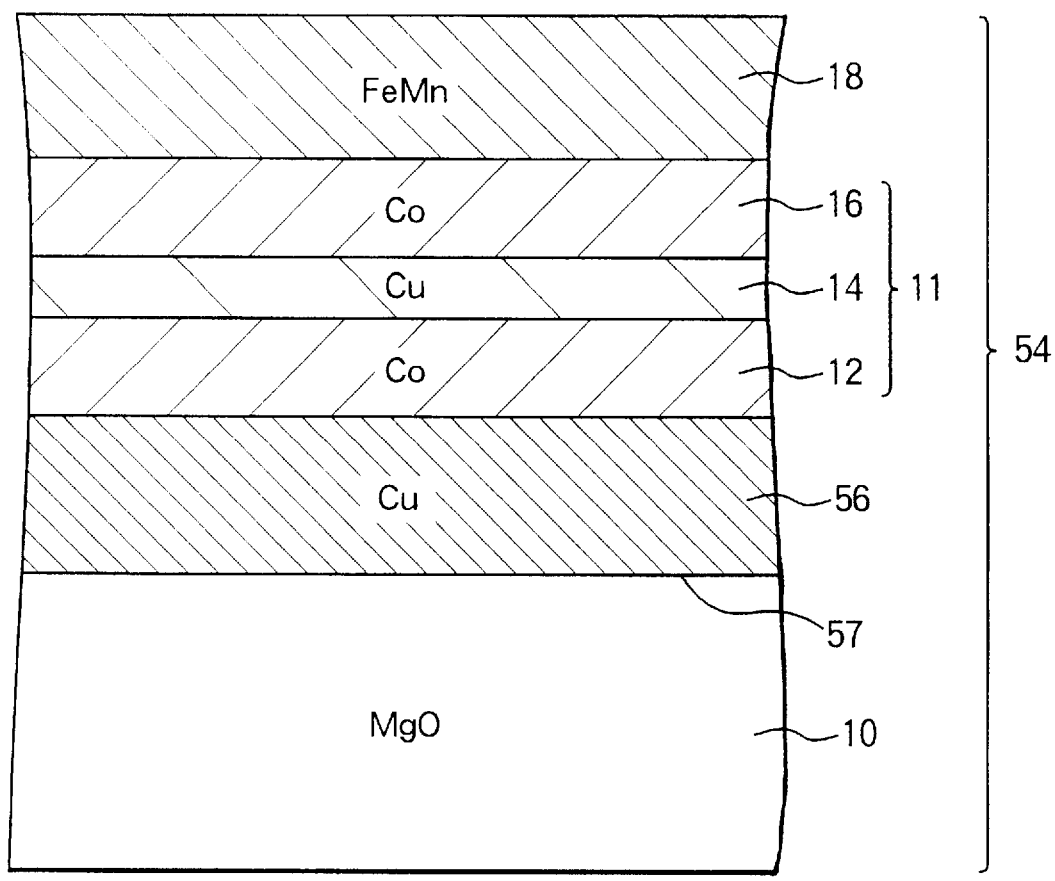
FIG. 10 illustrates a second embodiment of the invented information recording medium.

FIG. 10 illustrates a second novel information recording medium, using the same reference numerals as in FIG. 1 for identical or equivalent parts. The second novel medium 54 has the same base layer 10, giant magnetoresistive sandwich 11, and antiferromagnetic layer 18 as the first novel medium 8, but also has an electrode layer 56 formed on the upper surface 57 of the base layer 10, disposed between the base layer 10 and the first ferromagnetic layer 12.

The electrode layer 56 comprises a copper film 1000 Å thick. The other layers have the same composition and thickness as in the first novel medium 8. The magnetoresistance curve of the second novel medium 54 is similar to the magnetoresistance curve of the first novel medium 8.

Information can be recorded on the second novel medium 54 by the same methods and apparatus as used with the first novel medium. The same reproducing methods and apparatus can also be used, but the electrode layer 56 also permits further, and preferred, methods and apparatus to be employed, as described next.

Third reproducing method and apparatus

Figure 11:
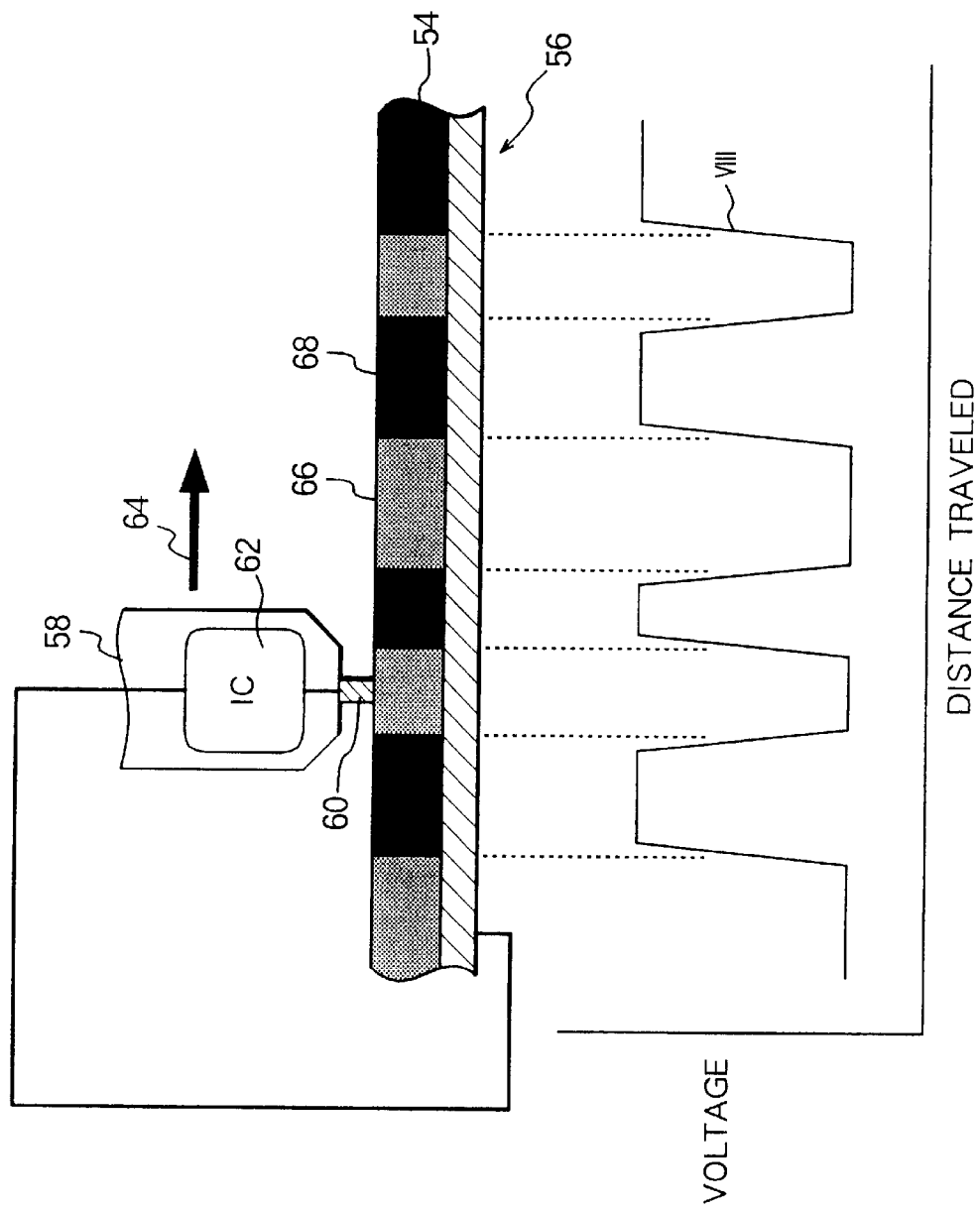
FIG. 11 illustrates a third method and apparatus for reproducing information, using the medium in FIG. 10.

FIG. 11 illustrates an method and apparatus for reproducing information recorded on the second novel medium 54. This method employs a single electrode.

The reproducing head 58 of this reproducing apparatus has a single electrode 60 coupled to a detector IC 62. The electrode 60 slides in contact with the medium 54 as the reproducing head 58 moves in the direction of the arrow 64 relative to the medium 54. The detector IC 62 is also coupled to the electrode layer 56 of the medium 54.

To reproduce information recorded on the medium 54, the detector IC 62 feeds a constant current between the electrode layer 56 and electrode 60, and detects the resulting voltage. Low-resistance regions 66 in the medium 54 produce one (e.g. low) voltage inside the detector IC 62, while high-resistance regions 68 produce another (e.g. high) voltage. The voltage variations are illustrated by curve VIII in the graph at the bottom of FIG. 11. The horizontal axis indicates distance traveled by the reproducing head 58 (or time, if the reproducing head 58 moves at a constant speed), and the vertical axis indicates the detected voltage (in arbitrary units).

An advantage of this third reproducing method, as compared with the first method illustrated in FIG. 8, is that it gives a sharper signal, as can be seen by comparing the resulting voltage waveforms VI and VIII. This is because only one electrode 60 makes contact with the medium 56.

Fourth reproducing method and apparatus

Figure 12:
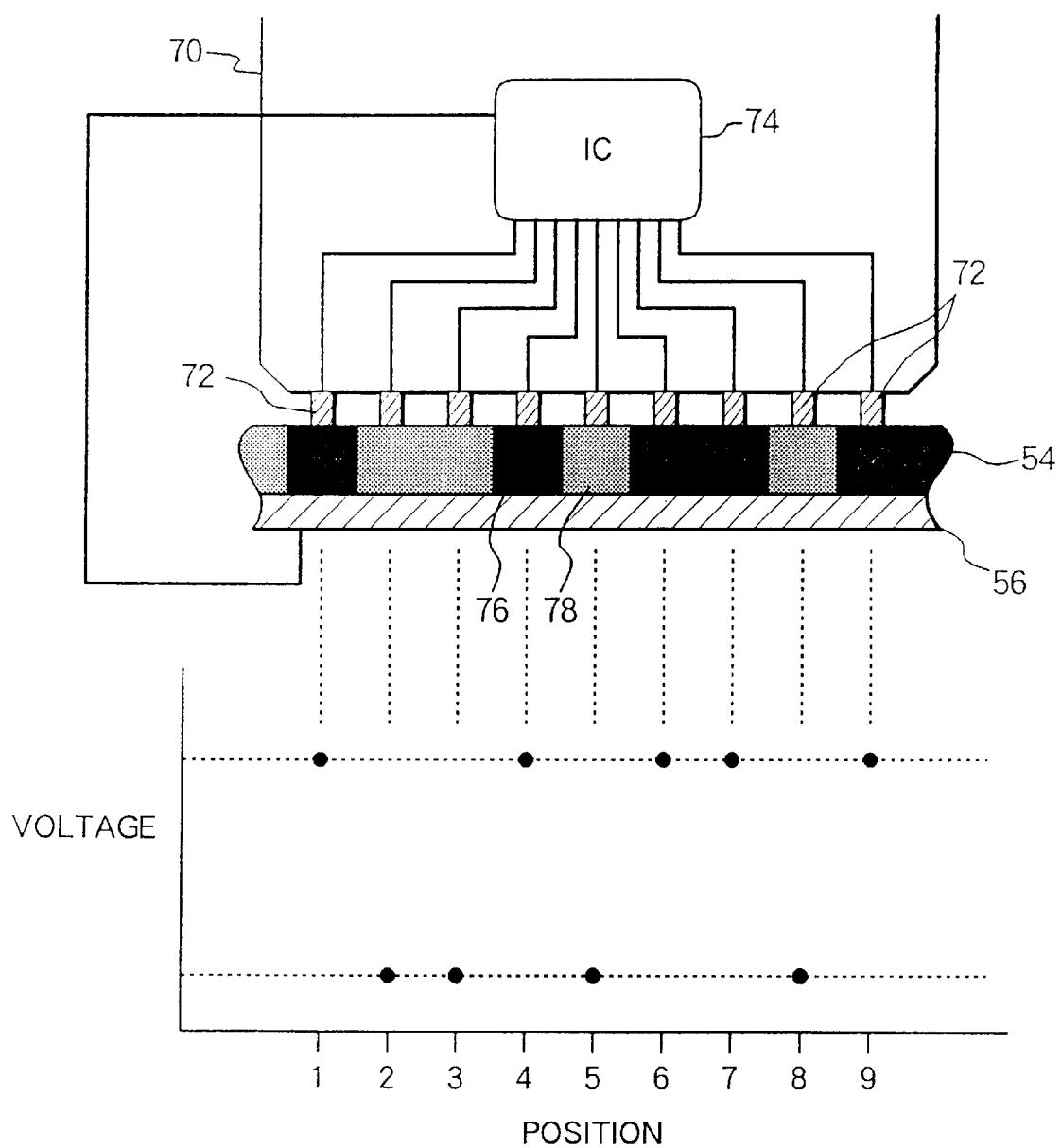
FIG. 12 illustrates a fourth method and apparatus for reproducing information, using the medium in FIG. 10.

FIG. 12 illustrates another method and apparatus for reproducing information from the second novel medium 54. This method employs an array of electrodes, and detects the electrical resistance between each electrode and the electrode layer 56.

The reproducing head 70 of this apparatus has a plurality of electrodes 72 which make contact with different bit cells in the medium 54. All of the electrodes 72 are coupled to a detector IC 74, which is also coupled to the electrode layer 56 of the medium 54.

To reproduce information, the electrodes 72 are positioned on respective bit cells 76, 78, . . . , preferably near the centers of the bit cells as illustrated. The detector IC 74 feeds a constant current between the electrode layer 56 and each of the electrodes 72, and detects the resulting voltages. As illustrated by the graph at the bottom of FIG. 12, bit cells 76 with high electrical resistance produce one (e.g. high) voltage, and bit cells 78 with low electrical resistance produce another (e.g. low) voltage. The vertical axis of this graph indicates the detected voltage, while the horizontal axis indicates electrode position, by electrode number.

As in the second reproducing method and apparatus, information can be reproduced without moving the head 70 relative to the medium 54, or information recorded in tracks can be reproduced by moving the head 70 or medium 54 in a direction perpendicular to the page.

An advantage of this fourth reproducing method, as compared with the second reproducing method, is that each electrode 72 reads one bit. The nine electrodes 72 in FIG. 12 therefore read nine bits of information, whereas the nine electrodes 46 in FIG. 9 read only eight bits of information. All nine bits can moreover be read simultaneously, and the circuitry for feeding current to the electrodes in the fourth reproducing apparatus can be simpler than the circuitry in the second reproducing apparatus.

Another advantage of the fourth reproducing method is that positioning the electrodes 72 over the centers of the bit cells allows more margin for positioning error than does positioning the electrodes over the boundaries between bit cells.

Third medium embodiment

Figure 13A:
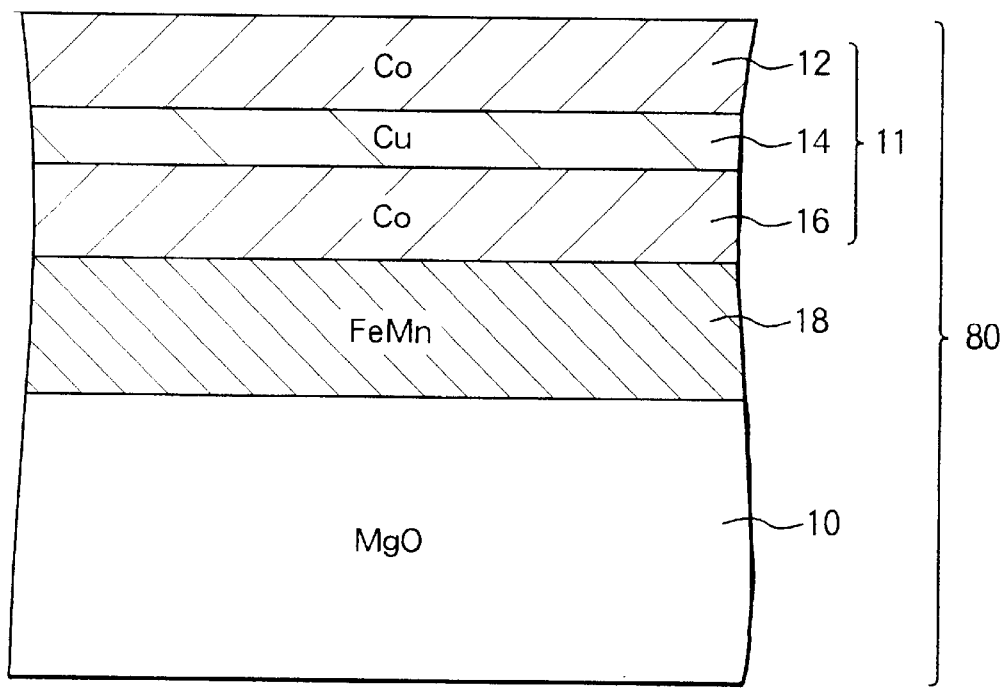
FIG. 13A illustrates a third embodiment of the invented information recording medium.

FIG. 13A illustrates a third novel information recording medium. This third medium 80 is identical to the first medium 8 except that the order of layers 12, 14, and 16 in the giant magnetoresistive sandwich 11 is reversed, and the antiferromagnetic layer 18 is disposed between the second ferromagnetic layer 16 and the base layer 10. The third medium 80 exhibits a magnetoresistance curve like that of the first medium 8, and permits information to be recorded and reproduced by the same methods and apparatus.

Fourth medium embodiment

Figure 13B:
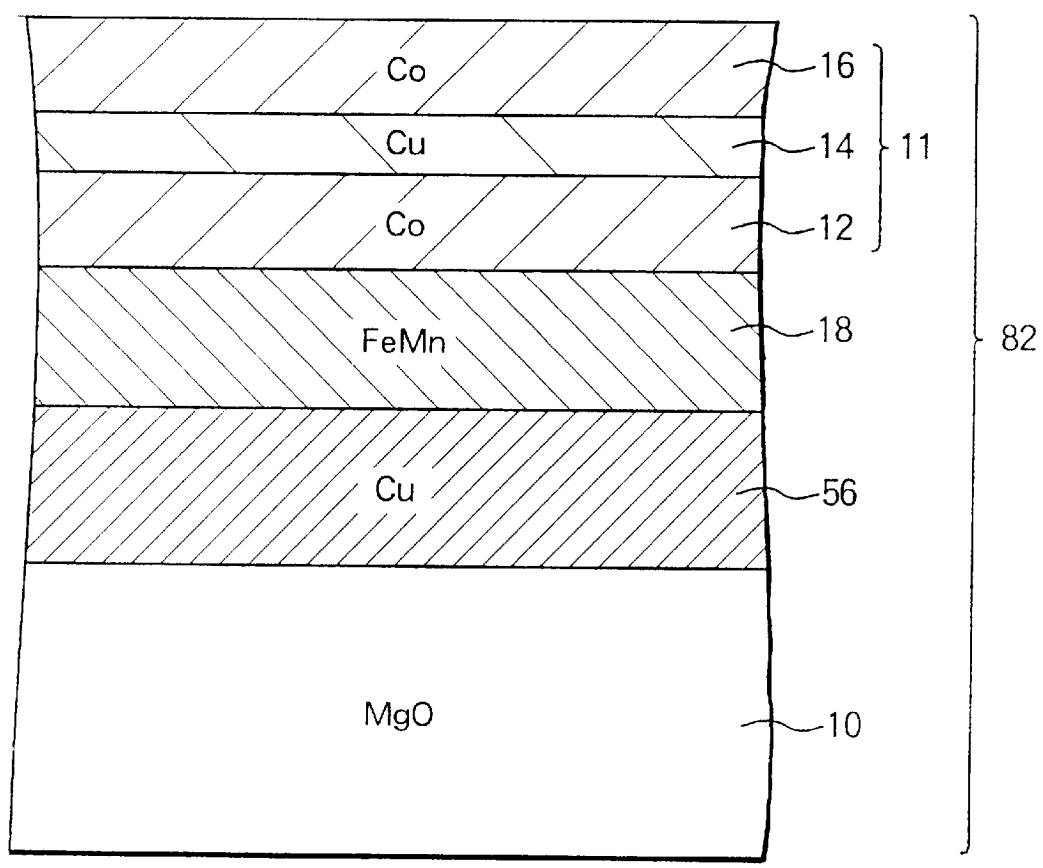
FIG. 13B illustrates a fourth embodiment of the invented information recording medium.

FIG. 13B illustrates a fourth novel information recording medium 82, which is identical to the second medium 54 except that the order of layers 12, 1r, and 16, and 18 is reversed, and the electrode layer 56 is disposed between the antiferromagnetic layer 18 and the base layer 10. The fourth medium 82 has characteristics similar to those of the second medium 54, and permits information to be recorded and reproduced by the same methods and apparatus.

Applications

It is anticipated that the invented media, methods, and apparatus will prove useful in a wide variety of information recording and reproducing applications, including cards bearing machine-readable/writable information, machine-readable/writable labels for packages, and information storage on rotating or non-rotating media in various types of information-processing systems. To mention just one of many conceivable applications, the invented media could be used to label integrated-circuit packages. The labels could be read by a small reproducing head of the electrode-array type, which could easily be accommodated in equipment for programming, testing, or otherwise handling integrated circuits.

Variations

No restriction is placed on the shape of the novel media described above. The media may be formed as a line, strip, disk, or sheet on any type of surface, whether flat, cylindrical, spherical, or of any other shape.

The ferromagnetic layers 12 and 16 may consist of ferromagnetic materials other than cobalt (Co), such as iron (Fe) or nickel (Ni), or an iron-nickel alloy, or an alloy of either or both of these metals with cobalt. Different ferromagnetic materials can be employed in the two layers, e.g. cobalt in the first ferromagnetic layer and nickel in the second ferromagnetic layer. The nonmagnetic interlayer 14 may comprise silver (Ag) or chromium (Cr) instead of copper (Cu). The antiferromagnetic layer 18 may comprise nickel oxide (NiO) or cobalt oxide (CoO) instead of an iron-manganese alloy (FeMn). Two examples of the many possible alternative layer configurations are Co/Cu/Co/NiO and Fe/Cr/Fe/FeMn. It is anticipated that good magnetoresistive characteristics can be obtained from a wide variety of configurations, provided magnesium oxide (MgO) is employed in the base layer 10.

The polarities of the magnetic recording fields can be reversed, so that $H_i$ and $H_c$ are parallel with the magnetization of the antiferromagnetic layer 18 and $H_a$, $H_b$, and $H_d$ are antiparallel. Specifically, the following schemes are possible:

$$H_b < H_{-S} < H_a < H_{-W} < H_{+S} < H_i$$

or $$H_d < H_{-S} < H_{+W} < H_c < H_{+S}$$

Those skilled in the art will recognize that further variations are possible within the scope claimed below.

What is claimed is:

1. A giant magnetoresistive information recording medium, comprising:
    a pair of ferromagnetic layers, consisting of a first ferromagnetic layer and a second ferromagnetic layer, said pair of ferromagnetic layers representing one information value when magnetized in a mutually parallel state and another information value when magnetized in a mutually antiparallel state, and having a lower electrical resistance in said mutually parallel state than in said mutually antiparallel state;
    a nonmagnetic interlayer disposed between said pair of ferromagnetic layers, for preventing exchange coupling between said ferromagnetic layers; and
    an antiferromagnetic layer magnetized in a fixed orientation and disposed adjacent said second ferromagnetic layer, for biasing said second ferromagnetic layer by exchange coupling, so that said second ferromagnetic layer is more easily magnetized parallel to said fixed orientation, and less easily magnetized antiparallel to said fixed orientation, than is said first ferromagnetic layer; wherein said first ferromagnetic layer, said nonmagnetic interlayer, said second ferromagnetic layer, and said antiferromagnetic layer are formed as a continuous multilayer, in which information can be recorded at any location, and wherein when recorded a plurality of information values are recorded in said continuous multilayer.

2. The medium of claim 1, further comprising a base layer of magnesium oxide.

3. The medium of claim 2, wherein said base layer is disposed adjacent said first ferromagnetic layer.

4. The medium of claim 2, wherein said base layer is disposed adjacent said antiferromagnetic layer.

5. The medium of claim 1, further comprising an electrode layer consisting of a conductive material.

6. The medium of claim 5, further comprising a base layer of magnesium oxide disposed adjacent said electrode layer.

7. The medium of claim 5, wherein said electrode layer is disposed adjacent said first ferromagnetic layer.

8. The medium of claim 5, wherein said electrode layer is disposed adjacent said antiferromagnetic layer.

9. The medium of claim 5, wherein said electrode layer comprises a copper film.

10. The medium of claim 1, wherein said first ferromagnetic layer and said second ferromagnetic layer are cobalt films, said nonmagnetic interlayer is a copper film, and said antiferromagnetic layer is an iron-manganese alloy film.

11. A method of recording and reproducing information in a medium having a pair of ferromagnetic layers as described in claim 1, comprising the steps of:

applying a first magnetic field to selected first regions of said medium such that said pair of ferromagnetic layers are magnetized in a mutually antiparallel state representing a first information value, said first information value thereby being recorded in said first regions;

applying a second magnetic field, stronger than said first magnetic field, to selected second regions of said medium such that said pair of ferromagnetic layers are magnetized in a mutually parallel state representing a second information value, said second information value thereby being recorded in said second regions; and reproducing the information values thus recorded in said first regions and said second regions by detecting the electrical resistance of said first regions and said second regions.

12. The method of claim 11, wherein said first magnetic field and said second magnetic field have opposite polarities.

13. The method of claim 11, wherein said first magnetic field and said second magnetic field have identical polarities, and further comprising the additional step of:

initializing said medium by applying a third magnetic field, stronger than said second magnetic field and opposite in polarity to said second magnetic field, to both said first regions and said second regions, thereby magnetizing said pair of ferromagnetic layers in a mutually parallel state.

14. The method of claim 11, wherein said step of reproducing the information values comprises:

placing a pair of electrodes in contact with said medium;

detecting electrical resistance between said pair of electrodes; and moving said pair of electrodes and said medium relative to each other, so that said pair of electrodes makes contact with each of said first regions and said second regions successively.

15. The method of claim 11, further comprising:

dividing said medium into regions, said regions being either first or second regions, said regions being adjacent and having boundaries therebetween; and wherein said step of reproducing the information values comprises:

placing an array of electrodes in contact with said medium at the boundaries between said regions; and detecting electrical resistance between pairs of electrodes among said electrodes.

16. The method of claim 11, wherein said medium comprises an electrode layer, and said step of reproducing the information values comprises:

placing an electrode in contact with said medium;

detecting electrical resistance between said electrode and said electrode layer; and moving said electrode and said medium relative to each other so that said electrode makes contact with each of said first regions and said second regions successively.

17. The method of claim 11, wherein said medium comprises an electrode layer, and said step of reproducing the information values comprises:

placing an array of electrodes in contact with said medium in different regions among said first regions and said second regions; and detecting electrical resistance between each of said electrodes and said electrode layer.

18. An information recording and reproducing apparatus, comprising:

the information recording medium of claim 1;

a recording head for applying a first magnetic field and a second magnetic field to said medium, said second magnetic field being stronger than said first magnetic field; and a reproducing head for detecting electrical resistance of different regions of said medium.

19. The information recording and reproducing apparatus of claim 18, wherein said reproducing head comprises:

a pair of electrodes for making contact with said medium; and a detector circuit for detecting electrical resistance of said medium between said pair of electrodes.

20. The information recording and reproducing apparatus of claim 18, wherein said reproducing head comprises:

an array of electrodes, for making simultaneous contact with said medium; and a detector circuit for detecting electrical resistance of said medium between adjacent electrodes in said array of electrodes.

21. The information recording and reproducing apparatus of claim 18, wherein said medium has an electrode layer, and said reproducing head comprises:

an electrode for making contact with said medium; and a detector circuit for detecting electrical resistance between said electrode and said electrode layer.

22. The information recording and reproducing apparatus of claim 18, wherein said medium has an electrode layer, and said reproducing head comprises:

an array of electrodes, for making simultaneous contact with different regions of said medium; and a detector circuit for detecting electrical resistance between each of said electrodes and said electrode layer.

23. A method of recording and reproducing information in a medium having a first ferromagnetic layer, a second ferromagnetic layer, a nonmagnetic interlayer, and an antiferromagnetic layer formed as a continuous multilayer such that a plurality of information values can be recorded in said medium, said plurality of information values comprising a first information value and a second information value, the method comprising the steps of:

applying a first magnetic field to a selected first region of said medium such that said pair of ferromagnetic layers are magnetized in a mutually antiparallel state representing said first information value, said first information value thereby being recorded in said first region;

applying a second magnetic field, stronger than said first magnetic field, to a selected second region of said medium such that said pair of ferromagnetic layers are magnetized in a mutually parallel state representing said second information value, said second information value thereby being recorded in said second region such that both said first and second information values are recorded in said medium; and reproducing said first and second information values thus recorded in said medium by detecting electrical resistance of said first and second regions.

24. The method of claim 23, wherein said first magnetic field and said second magnetic field have opposite polarities.

25. The method of claim 23, wherein said first magnetic field and said second magnetic field have identical polarities, and further comprising the additional step of:

initializing said medium by applying a third magnetic field, stronger than said second magnetic field and opposite in polarity to said second magnetic field, to both said first regions and said second regions, thereby magnetizing said pair of ferromagnetic layers in a mutually parallel state.

26. The method of claim 23, wherein said step of reproducing the information values comprises:

placing a pair of electrodes in contact with said medium;

detecting electrical resistance between said pair of electrodes; and moving said pair of electrodes and said medium relative to each other, so that said pair of electrodes makes contact with each of said first regions and said second regions successively.

27. The method of claim 23, further comprising:

dividing said medium into regions, said regions being either first or second regions, said regions being adjacent and having boundaries there between; and wherein said step of reproducing the information values comprises:

placing an array of electrodes in contact with said medium at the boundaries between said regions; and detecting electrical resistance between pairs of electrodes among said electrodes.

28. The method of claim 23, wherein said medium comprises an electrode layer, and said step of reproducing the information values comprises:

placing an electrode in contact with said medium;

detecting electrical resistance between said electrode and said electrode layer; and moving said electrode and said medium relative to each other, so that said electrode makes contact with each of said first regions and said second regions successively.

29. The methods of clam 23, wherein said medium comprises an electrode layer, and said step of reproducing the information values comprises:

placing an array of electrodes in contacting with said medium in different regions among said first regions and said second regions; and detecting electrical resistance between each of said electrodes and said electrode layer.

30. An information recording and reproducing apparatus, comprising:

an information recording medium comprising:

a first ferromagnetic layer having an upper surface;

a nonmagnetic interlayer having a lower surface coupled to the upper surface of said first ferromagnetic layer and an upper surface;

a second ferromagnetic layer having a lower surface coupled to the upper surface of said nonmagnetic interlayer and an upper surface; and an antiferromagnetic layer having a lower surface coupled to the upper surface of said second ferromagnetic layer;

a recording head for applying a first magnetic field and a second magnetic field to said medium such that a plurality of information values are recorded in said medium, said second magnetic field being stronger than said first magnetic field, said recording head and said medium having relative motion therebetween; and a reproducing head for detecting electrical resistance of different regions of said medium.

31. The information recording and reproducing apparatus of claim 30, wherein said reproducing head comprises:

a pair of electrodes for making contact with said medium; and a detector circuit for detecting electrical resistance of said medium between said pair of electrodes.

32. The information recording and reproducing apparatus of claim 30, wherein said reproducing head comprises:

an array of electrodes, for making simultaneous contact with said medium; and a detector circuit for detecting electrical resistance of said medium between adjacent electrodes in said array of electrodes.

33. The information recording and reproducing apparatus of claim 30, wherein said medium has an electrode layer, and said reproducing head comprises:

an electrode for making contact with said medium; and a detector circuit for detecting electrical resistance between said electrode and said electrode layer.

34. The information recording and reproducing apparatus of claim 30, wherein said medium has an electrode layer, and said reproducing head comprises:

an array of electrodes, for making simultaneous contact with different regions of said medium; and a detector circuit for detecting electrical resistance between each of said electrodes and said electrode layer.

* * * * *